(12) United States Patent
De Jong et al.

(10) Patent No.: US 11,376,785 B2
(45) Date of Patent: Jul. 5, 2022

(54) METHOD FOR MANUFACTURING A 3D ITEM HAVING AN ELECTRICALLY CONDUCTIVE COIL

(71) Applicant: SIGNIFY HOLDING B.V., Eindhoven (NL)

(72) Inventors: Boudewijn Ruben De Jong, Eindhoven (NL); Maurice Herman Johan Draaijer, Ittervoort (NL); Jacobus Petrus Johannes Van Os, Eindhoven (NL)

(73) Assignee: SIGNIFY HOLDING B.V., Eindhoven (NL)

( * ) Notice: Subject to any disclaimer, the term of this patent is extended or adjusted under 35 U.S.C. 154(b) by 351 days.

(21) Appl. No.: 16/636,927

(22) PCT Filed: Jul. 23, 2018

(86) PCT No.: PCT/EP2018/069889
§ 371 (c)(1),
(2) Date: Feb. 6, 2020

(87) PCT Pub. No.: WO2019/029979
PCT Pub. Date: Feb. 14, 2019

(65) Prior Publication Data
US 2020/0361138 A1  Nov. 19, 2020

(30) Foreign Application Priority Data

Aug. 11, 2017 (EP) ..................................... 17185829

(51) Int. Cl.
*B29C 64/118* (2017.01)
*B29C 64/209* (2017.01)
(Continued)

(52) U.S. Cl.
CPC .......... *B29C 64/118* (2017.08); *B29C 64/209* (2017.08); *B29C 64/336* (2017.08); *B29L 2031/3406* (2013.01); *B29L 2031/3425* (2013.01); *B29L 2031/3462* (2013.01); *B29L 2031/3468* (2013.01); *B29L 2031/3487* (2013.01); *B33Y 10/00* (2014.12); *B33Y 80/00* (2014.12)

(58) Field of Classification Search
CPC ... B29C 64/118; B29C 64/209; B29C 64/336; B29L 2031/3406; B29L 2031/3425; B29L 2031/3468; B29L 2031/3487; B33Y 10/00
See application file for complete search history.

(56) References Cited

U.S. PATENT DOCUMENTS

| 2009/0177309 A1 | 7/2009 | Kozlak |
| 2013/0170171 A1 | 7/2013 | Wicker et al. |

(Continued)

FOREIGN PATENT DOCUMENTS

| CN | 104924610 A | 9/2015 |
| CN | 106067423 A | 11/2016 |

(Continued)

OTHER PUBLICATIONS

Bas De Bruijn, "Additive Wire-Laying", basedebruijn.com; May 23, 2014, XP055445659, http://basebruijn.com/2014/05/additive-wire-layering/.

(Continued)

*Primary Examiner* — Joseph S Del Sole
*Assistant Examiner* — Manley L Cummins, IV
(74) *Attorney, Agent, or Firm* — Daniel J. Piotrowski

(57) ABSTRACT

The invention provides a method for manufacturing a 3D item (10) comprising an electrically conductive coil (140) of at least part of an electrically conductive wire (51), wherein the method comprising printing with a fused deposition modeling (FDM) 3D printer (500) 3D printable material (201), wherein the 3D printable material (201) comprises the electrically conductive wire (51), to provide the 3D item (10) comprising the electrically conductive coil (140).

10 Claims, 7 Drawing Sheets

(51) Int. Cl.
*B29C 64/336* (2017.01)
*B33Y 10/00* (2015.01)
*B33Y 80/00* (2015.01)
*B29L 31/34* (2006.01)

(56) References Cited

U.S. PATENT DOCUMENTS

| | | | |
|---|---|---|---|
| 2014/0361460 A1 | 12/2014 | Mark | |
| 2016/0052208 A1* | 2/2016 | Debora | B22F 12/90 425/166 |
| 2016/0136887 A1* | 5/2016 | Guillemette | C08J 5/121 425/297 |
| 2018/0050486 A1* | 2/2018 | Talgorn | B33Y 10/00 |
| 2018/0117841 A1* | 5/2018 | Tyler | B32B 5/12 |

FOREIGN PATENT DOCUMENTS

| | | |
|---|---|---|
| CN | 106211622 A | 12/2016 |
| JP | 2016-531770 A | 10/2016 |
| JP | 2018-512302 A | 5/2018 |
| JP | 2019-517404 A | 6/2019 |
| KR | 20110057650 A | 6/2011 |
| WO | 2013035017 A2 | 12/2014 |
| WO | 2015077262 A1 | 5/2015 |
| WO | 2015/136982 A1 | 9/2015 |

OTHER PUBLICATIONS

Matt Saari et al., "Fiber Encapsulation Additive Manufacturing: An Enabling Technology for 3D Printing of Electromechanical Devices and Robotic Components", 3D Printing and Additive Manufacturing, vol. 2, No. 1 Mar. 1, 2015; pp. 32-39, XP055445158, ISSN: 2329-7662, DOI: 10.1089/3dp.2015.0003.

Bas De Bruijn, "Additive Wire-Laying", May 12, 2014, XP055445665, https://raw.githubusercontent.com/luminize/open-ideas/master/additive-manufacturing-of-PCBs/additive%20manufacturing%20of%20PCB.jpg.

Sung-Yeh Wu et al., "3D-printed microelectronics for integrated circuitry and passive wireless sensors", Microsystems & Nanoengineering (2015), 1, 15013; doi:10.1038/micronano.2015.13; www.nature.com/micronano.

\* cited by examiner

METHOD FOR MANUFACTURING A 3D ITEM HAVING AN ELECTRICALLY CONDUCTIVE COIL

CROSS-REFERENCE TO PRIOR APPLICATIONS

This application is the U.S. National Phase application under 35 U.S.C. § 371 of International Application No. PCT/EP2018/069889, filed on Jul. 23, 2018, which claims the benefit of European Patent Application No. 17185829.3, filed on Aug. 11, 2017. These applications are hereby incorporated by reference herein.

FIELD OF THE INVENTION

The invention relates to a method for manufacturing a 3D item using a fused deposition modelling printer.

BACKGROUND OF THE INVENTION

The 3D printing with inputs is known in the art.

WO-2015/077262 describes 3D printer inputs including filaments comprising separated layers or sections. These inputs, particularly including filaments, may be prepared by coextrusion, microlayer coextrusion or multicomponent/fractal coextrusion. These inputs and specifically filaments enable layering or combining different materials simultaneously through one or more nozzles during the so-called 3D printing process. These techniques facilitate smaller layer sizes (milli, micro, and nano) different layer configurations as well as the potential to incorporate materials that would otherwise not be usable in standard 3D printer methods. Further, this document mentions a 3D printer nozzle or hot end which extrudes a 3D printer deflected output flow wherein said output comprise additional elements such as electronic, optical, magnetic, metallic, biologic, structural, durable, thermal, medical, photovoltaic or pharmaceutical.

US-2014/361460 discloses a method of manufacturing an object using a 3D printer and a reinforced filament, wherein the latter is fed into an extrusion nozzle of the 3D printer. The reinforced filament includes a core, which may be continuous or semi-continuous, and a matrix material surrounding the core. The reinforced filament is heated to a temperature greater than a melting temperature of the matrix material and less than a melting temperature of the core prior to extruding the filament from the extrusion nozzle. The method is used to manufacture an object having a printed subcomponent that forms a conductive coil of a motor, wound around the Z direction.

SUMMARY OF THE INVENTION

Within the next 10-20 years, digital fabrication will increasingly transform the nature of global manufacturing. One of the aspects of digital fabrication is 3D printing. Currently many different techniques have been developed in order to produce various 3D printed objects using various materials such as ceramics, metals and polymers. 3D printing can also be used in producing molds which can then be used for replicating objects.

For the purpose of making molds, the use of polyjet technique has been suggested. This technique makes use of layer by layer deposition of photo-polymerisable material which is cured after each deposition to form a solid structure. While this technique produces smooth surfaces the photo curable materials are not very stable and they also have relatively low thermal conductivity to be useful for injection molding applications.

The most widely used additive manufacturing technology is the process known as Fused Deposition Modeling (FDM). Fused deposition modeling (FDM) is an additive manufacturing technology commonly used for modeling, prototyping, and production applications. FDM works on an "additive" principle by laying down material in layers; a plastic filament or metal wire is unwound from a coil and supplies material to produce a part. Possibly, (for thermoplastics for example) the filament is melted and extruded before being laid down. FDM is a rapid prototyping technology. Other terms for FDM are "fused filament fabrication" (FFF) or "filament 3D printing" (FDP), which are considered to be equivalent to FDM. In general, FDM printers use a thermoplastic filament, which is heated to its melting point and then extruded, layer by layer, (or in fact filament after filament) to create a three dimensional object. FDM printers are relatively fast and can be used for printing complicated object.

Materials that may especially qualify as 3D printable materials may be selected from the group consisting of metals, glasses, thermoplastic polymers, silicones, etc. Especially, the 3D printable material comprises a (thermoplastic) polymer selected from the group consisting of ABS (acrylonitrile butadiene styrene), Nylon (or polyamide), Acetate (or cellulose), PLA (poly lactic acid), terephthalate (such as PET polyethylene terephthalate), Acrylic (polymethylacrylate, Perspex, polymethylmethacrylate, PMMA), Polypropylene (or polypropene), Polystyrene (PS), PE (such as expanded-high impact-Polythene (or polyethene), Low density (LDPE) High density (HDPE)), PVC (polyvinyl chloride) Polychloroethene, etc. Optionally, the 3D printable material comprises a 3D printable material selected from the group consisting of Urea formaldehyde, Polyester resin, Epoxy resin, Melamine formaldehyde, Polycarbonate (PC), rubber, etc. Optionally, the 3D printable material comprises a 3D printable material selected from the group consisting of a polysulfone, a polyether sulfone, a polyphenyl sulfone, an imide (such as a poly ether imide) etc.

The term "3D printable material" may also refer to a combination of two or more materials. In general these (polymeric) materials have a glass transition temperature $T_g$ and/or a melting temperature $T_m$. The 3D printable material will be heated by the 3D printer before it leaves the nozzle to a temperature of at least the glass transition temperature, and in general at least the melting temperature. Hence, in a specific embodiment the 3D printable material comprises a thermoplastic polymer having a glass transition temperature $(T_g)$ and/or a melting point $(T_m)$, and the printer head action comprises heating the one or more of the receiver item and 3D printable material deposited on the receiver item to a temperature of at least the glass transition temperature, especially to a temperature of at least the melting point. In yet another embodiment, the 3D printable material comprises a (thermoplastic) polymer having a melting point $(T_m)$, and the printer head action comprises heating the one or more of the receiver item and 3D printable material deposited on the receiver item to a temperature of at least the melting point.

Specific examples of materials that can be used can e.g. be selected from the group consisting of acrylonitrile butadiene styrene (ABS), polylactic acid (PLA), polycarbonate (PC), polyamide (PA), polystyrene (PS), lignin, rubber, etc.

FDM printers are relatively fast, low cost and can be used for printing complicated 3D objects. Such printers are used in printing various shapes using various polymers. The technique is also being further developed in the production of LED luminaires and lighting solutions. However, for including electronic components conventional solutions may complicate the production process as the 3D printed object under construction may have to leave the printing stage to have included the electronic component.

Hence, it is an aspect of the invention to provide an alternative 3D printing method, which preferably further at least partly obviates one or more of above-described drawbacks. The method uses a fused deposition modeling 3D printer to provide in a relatively easy way 3D printed objects with one or more of electronic components, electrical wires, and other electrically conductive parts.

It appears desirable to be able to integrate conductive lines and connect them to electronic components such as LEDs and passive components such as resistors and capacitors. Amongst others, for electrical conductivity 3D printing of electrical wires which have high reliability and low electrical resistance is proposed. However, during the printing process using soldering is rather difficult to obtain reliable electrical connection of the electrical wires with the components. Hence, amongst others it is herein also suggested to make small electrical circuits (e.g. sub millimeter size) part of the extruded filament used in FDM printing, during the fabrication of the filament or at the moment of extrusion in the printer itself, or even during the printing. The aim is to embed complete electrical circuits directly into the housing of a product (e.g. luminaire) without need for separate assembly steps. The circuits can exchange signals and power to one another via inductive loops formed during the printing process (or provided preceding the process in the 3D printable material).

Hence, herein it is proposed to use filaments for FDM printers containing an electrically conductive wire and/or other elements such as LEDs. It is herein suggested using a pre-configured filament with inclusions where the (objects such as) electrically conductive wire and/or other elements, such as LEDs can be placed. In order to do this, the software which drives the printer to produce 3D objects can be used to generate instructions for configuring the filaments to place the electrically conductive wire and/or other elements, such as LEDs, at the desired position.

Hence, in a first aspect the invention provides a method for manufacturing a 3D item using a fused deposition modeling (FDM) 3D printer ("printer" or "3D printer"), the 3D item comprising an electrically conductive coil of at least part of an electrically conductive wire ("wire"), wherein the method comprises the step of printing, during a printing stage, 3D printable material ("printable material") to provide the 3D item ("item" or "3D printed item" or "printed item") comprising the electrically conductive element, such as especially electrically conductive coil. The 3D printable material comprises the electrically conductive wire and an electronic component in electrically conductive contact with the electrically conductive wire. With such method, it is for instance possible to print in one run both the filament and the electrically conductive element. Though two (or more) printer heads may be used, it is not necessary to use two printer heads. Even more, it is not necessary to remove the 3D printed object under construction from the stage and/or introduce e.g. another robotic device for introduction of the electronics on the stage. Further, with the present method the electronic device can be fully embedded in the 3D printed object. Hence, with the present invention based on, in embodiments, (polymeric) filaments combined with one or more electrically conductive elements, such as an electrical wire, an electrical wire configured as coil, an electrical component together with the filament material may be printed, i.e. provided as printable material and printed on a substrate or on already 3D printed layers on the substrate. However, with the present invention it is also possible to create electrically conductive coils during the printing stage, by configuring the electrically conductive wire into a coil configuration. The coil can be used for wireless powering, for communication, etc. Further, the 3D printing method allows a precise positioning of the electrically conductive elements. This allows that circuits can exchange signals and power to one another via inductive loops.

Herein, the term "electrically conductive element" refers to any component through which an electrical current can flow and/or which can be configured in an electrical circuit. The term "electrically conductive element" may also refer to a plurality of (different) electrically conductive element. In specific embodiments, two or more of the electrically conductive elements may functionally be coupled, such as an electronic component and an electrically conductive wire, or such as an electronic component, and electrically conductive wire and a coil (for wireless power transfer). Hence, the term "electrically conductive element" may refer to an electrically conductive wire, an electronic component (such as a LED), and a combination of electrically conductive elements, such as an electronic circuit. In specific embodiments, the term "electrically conductive element" may also refer to a semiconductor.

The term "electrically conductive element" may refer to an electrically conductive wire. The electrically conductive wire may especially comprise copper as electrically conductive material.

Such wire may include an electrically isolating coating, as known in the art. When the wire comprises an electrically isolating coating, in principle the wire may be a multiple-core cable, such as a double-core cable. However, especially the wire, when including electrical insulation, comprises a single core cable.

Such wire may in embodiments also not include an electrically isolating coating, which may facilitating e.g. closing of an electrical circuit by physically contacting two parts of the wire.

Such wire may also include parts with an electrically isolating coating and parts without an electrically isolating coating, such as alternating parts (along the length of the wire) with and without electrically isolating coating. This may also facilitate e.g. closing of an electrical circuit (see above), while also having isolating properties. The 3D printable material is (essentially) electrically insulating.

Herein, an electrically conductive material may especially comprise a conductivity (at room temperature) of at least $1\cdot10^5$ S/m, such as at least $1\cdot10^6$ S/m. Herein, an electrical conductivity of an insulated material may especially be equal to or smaller than $1\cdot10^{-10}$ S/m, especially equal to or smaller than $1\cdot10^{-13}$ S/m. Herein a ratio of an electrical conductivity of an isolating material (insulator) and an electrical conductivity of a conductive material (conductor) may especially be selected smaller than $1\cdot10^{-15}$.

The term "electrically conductive element" may also refer to an electronic component. The electronic component may include an active or a passive electronic component. An active electronic component may be any type of circuit component with the ability to electrically control electron flow (electricity controlling electricity). Examples thereof are diodes, especially light emitting diodes (LED). LEDs are herein also indicated with the more general term solid state lighting devices or solid state light sources. Hence, in embodiments the electronic component comprises an active electronic component. Especially, the electronic component comprises a solid state light source. Other examples of active electronic components may include power sources, such as a battery, a piezo-electric device, an integrated circuit (IC), and a transistor. In yet other embodiments, the electronic component may include a passive electronic component. Components incapable of controlling current by means of another electrical signal are called passive devices. Resistors, capacitors, inductors, transformers, etc. can be considered passive devices.

In an embodiment, the electronic component may include an RFID (Radio-frequency identification) chip. A RFID chip may be passive or active.

Especially, the electronic component may include one or more of a solid state light source (such as a LED), a RFID chip, and an IC.

Further examples of electronic components are a thermo couple, a thermopile, a resistor (especially configured for use in sensing mode), a transistor (especially configured for use in sensing mode), a diode (e.g. Schottky diode, a Zener diode, a TVS (transient-voltage-suppression) diode)), a battery, a super capacitor, a heating resistor, a Hall sensor, a PV cell, an organic semiconductor (e.g. light emitting), an accelerometer, an electronic compass, a gyroscope, and inductor, etcetera.

The conductive coil may functionally be coupled with the electronic component.

Of course, a plurality of (different) electronic components may be applied, such as a circuit of two or more electronic components.

Hence, in embodiments the electronic component comprises one or more of a thermo couple, a thermopile, a resistor, a transistor, a diode, a battery, a capacitor, a super capacitor, a heating resistor, a Hall sensor, a PV cell, an organic semiconductor, an accelerometer, an electronic compass, a gyroscope, an electronic circuit. The diode may in embodiments comprise a light emitting diode. In specific embodiments, the electronic component comprises an electronic circuit.

The term "electronic component" may also refer to a plurality of alike or a plurality of different electronic components.

In embodiments, the electronic component may comprise a coil (or wire coil). Such coil may be configured for wireless power transfer, especially in embodiments to receive electrical power via induction from an external source (external from the 3D printed item). Alternatively or additionally, the coil may be configured as transmitter or receiver of an electromagnetic wave. The coil may in embodiments be configured as transducer. Hence, the conductive coil may thus also be an electronic component, but is in general defined separate thereof; i.e. the term "electronic component refers to an electronic component as defined herein, but not being a coil, as in embodiments the coil may be available per se.

The filament downstream of a printer nozzle of the 3D printer may have filament diameter selected from the range of 0.1-50 mm, such as especially 0.5-5 mm The electronic component has dimensions such that is can be embedded in the 3D printable material, also downstream of the printer nozzle. Hence, the electronic component has dimensions selected from e.g. width and height, and diameter(s) smaller than the filament diameter of the filament downstream of the printer nozzle, such as at maximum 80%, like at maximum 50% of the filament diameter. In embodiments, the electronic components has dimensions selected from e.g. width and height, and diameter(s) with values selected from the range of 1-500 μm. The length may be in the same ranges, but may also be longer, such as 0.5-10 mm, like 0.5-5 mm.

Likewise, the electrically conductive wire (optionally including the insulating coating) has dimensions such that it can be embedded in the 3D printable material, also downstream of the printer nozzle. Hence, the electrically conductive wire has dimensions selected from e.g. width and height, and diameter(s) smaller than the filament diameter of the filament downstream of the printer nozzle, such as at maximum 80%, like at maximum 50% of the filament diameter. In embodiments, the electrically conductive wire has dimensions selected from e.g. width and height, and diameter(s) with values selected from the range of 1-500 μm. The length may be in the same ranges, but may also be longer, such as 0.5-10 mm, like 0.5-5 mm, but may also be much longer, such as such as at least 5 mm, like at least 10 mm, such as at least 10 cm, like even at least 50 cm, such as at least 1 m.

In specific embodiments, the electronic component may have dimensions smaller than the minimum bending radius of the filament during printing. Should a lead frame be used (see further below), also especially such lead frame may have dimensions smaller than the minimum bending radius of the filament during printing. Likewise, especially the electrically conductive wire component may have dimensions smaller than the minimum bending radius of the filament during printing. The minimum bending radius may be about the diameter of the filament (downstream of the printer nozzle). In embodiments, the dimensions are smaller than 80% of the minimum bending radius, such as 50% of the minimum bending radius. In yet other embodiments, the dimensions selected from e.g. width and height, and diameter(s) are smaller than 80% of the diameter of the filament (downstream of the printer nozzle), such as 50% of the diameter of the filament (downstream of the printer nozzle).

Especially, such dimensions may be relevant when the electronic component is rigid. However, when the electronic component, or one or more parts thereof, are flexible, one or more dimensions may also be larger.

In embodiments, the electronic component may be functionally coupled with an electrically conductive wire. Especially, the electronic component may in embodiments be functionally coupled with electrically conductive wires at both electrical connections of the electronic component. In such embodiments, the total length of the electrically conductive wire(s) may in embodiments be at least 10 mm, such as at least 20 mm, like at least 50 mm.

During the printing of the 3D printable material, the electronic component and/or the coil may also be heated. Hence, the dimensions may be chosen such, that during printing only part of the electronic component and/or coil is heated, and another part is not heated (directly), as the dimensions may be chosen such, that part of the electronic component or part of the coil is lower in temperature than another part during the printing process, the part lower in temperature may be used as thermal conductor to guide heat away. To this end, also the (remaining) electrically conductive wire may be applied. Therefore, in embodiments the electronic component, or the electronic component and the electrically conductive wire together, have a length of at least a length of a printer head of the fused deposition modeling 3D printer. In this way, e.g. the leadframe or electrical component, or circuit may be optimized (in length) to guide the heat away during printing.

As indicated above, in an aspect the invention also provides an electrically conductive coil, e.g. for wireless power transmission or for one or more of receiver, transmitter, and transducer purposes. One or more coils can be created in different ways, such as by creating the coil by 3D printing, or by 3D printing the coil per se.

In the former embodiment, the movement of the nozzle (and/or (optionally) receiver item, see also below) creates a pattern of filaments during 3D building the 3D item which pattern includes the pattern of a coil, and thereby a coiled wire. Hence, in embodiments the method comprises controlling the printing of the 3D printable material comprising the electrically conductive wire to provide during the printing stage 3D printed material in a coil configuration and provide thereby the electrically conductive coil. Hence, the coil is in these embodiments not available in the 3D printable material, but the coil (shape) is created during the printing process (and is thus obtained in the 3D printed material).

In the latter embodiment, the 3D printable material comprises the electrically conductive coil. In other words, the coil is introduced in the 3D printable material in the printer nozzle or upstream thereof.

Of course, also combinations of differently obtainable coils may be applied.

For wireless power transfer the coil may have one or more windings, each having an equivalent circular diameter of at least about 5 mm, such as about 5-200 mm, such as at least 10 mm. Larger equivalent circular diameters may also be applied as the entire 3D printed object may be used for embedding the coil. Here, the term equivalent circular diameter is applied, as the windings are not necessarily configured in circles, but may also be configured in (rounded) rectangles (including square), etc. Hence, when a coil is created during printing, the length of the wire may be at least 50 mm.

During printing, 3D printable material is guided through the printer nozzle. In general, this includes an elongation stage. The printer head may include a funnel like element wherein the (equivalent circular) diameter upstream of the printer nozzle is larger than the (equivalent circular) diameter of the printer nozzle. Therefore, in embodiments the electronic component may be one or more of (internally) coiled, braided, weaved, folded, or stacked, in such a way that when printed, the substrate will release with the length of the printed material. Likewise, in embodiments the electrically conductive wire may be one or more of (internally) coiled, braided, weaved, folded, or stacked, in such a way that when printed, the substrate will release with the length of the printed material. Therefore, in embodiments the electrically conductive wire is comprised in 3D printable material upstream of a printer nozzle of the 3D printer, wherein at least part of the electrically conductive wire is in a compressed state allowing elongation of the electrically conductive wire when the 3D printable material is stretched out in a filament elongation stage.

Alternatively (or additionally), the electrically conductive element, such as especially an electrically conductive wire, may be provided downstream of such elongation stage. Hence, in embodiments the method comprises combining the electrically conductive wire and the 3D printable material downstream of a printer nozzle of the 3D printer. Alternatively or additionally, in embodiments the method comprises combining the electronic component (such as a LED), or a combination of electrically conductive elements, such as an electronic circuit, etc., and the 3D printable material downstream of a printer nozzle of the 3D printer.

The electrically conductive element or the combination of electrically conductive elements in the filament downstream of the printer nozzle may during deposition of the filament, especially e.g. when the printer head turns or rotates relative to the deposited material, may be subject to stress or other forces. As the 3D printable material may be more flexible and may have different bending and/or rotation behavior than the 3D printable material, there may be the risk of the electrically conductive element at least partially extending from the filament. In order to prevent such behavior, or reduce the tendency, the electrically conductive element may include a stability element for maintaining the electrically conductive element in the filament.

Hence, in specific embodiments the electrically conductive wire comprises a stability element for maintaining the electrically conductive wire embedded in the 3D printable material of a filament downstream of a printer nozzle of the 3D printer. The term "stability element" may also refer to a plurality of stability elements. The stability element may e.g. have the shape of a pin, a fin, a ridge, etc. which may extend relative to the electrically conductive element in a direction away of a length axis or axis of elongation of the filament. Such stability element may have the shape of a keel, fin or a skeg. Further, the stability element may consist of at least two or more parts that are configured under (a) mutual angle(s) selected from the range of 45-135°.

Other embodiments of the electrically conductive element may also comprise one or more of such stability elements.

In the method according to the invention, the 3D printable material further comprises an electronic component in electrically conductive contact with the electrically conductive wire. Of course, the 3D printable material may also comprise a plurality of electronic components in electrical conductive contact with one or more electrically conductive wires. In embodiments, a plurality of electronic components are configured in series. Hence, in such embodiments, effectively a single wire may with the electronic components configured in series is obtained. Such single wire with components may also be 3D printed with the herein described method and/or 3D printer.

Examples of the electronic component(s) are provided above. In specific embodiments, the electronic component comprises one or more of a solid state light source and a sensor, such as an optical sensor.

In further embodiments, the electronic component is functionally coupled with a lead frame. In yet further embodiments, a plurality of (different) electronic components are functionally coupled with a single lead frame. In this way, the lead frame may host one or more electrical circuits, each including one or more electronic components and/or a coil. Further, such lead frame may include one, especially (at least) two electrically conductive wires for connection with a source of power, or a coil. The source of power can be configured external the 3D item, or may also be embedded in the 3D item. With a coil, via induction the lead frame may be electrically powered.

When e.g. a coil is generated during printing, or when a wire is implemented in the 3D item via the filament, (after printing) the ends of the wire (of the coil) may protrude or may be made to protrude from the 3D item, for physical coupling with an external source of power, or other functional coupling. However, it may also be possible to close a circuit, and provide the entire circuit in the 3D printed material. For instance, this may be achieved by printing an end part of the wire against another end part of the wire, or by printing an end part of the wire against an electrically conductive part functionally available in a circuit. For instance, a printer head may push a filament, and thereby the wire (end part), against another end part of the wire or the electrically conductive part available in the circuit, e.g. a part of a lead frame.

Hence, in embodiments the method may further comprise an electrical circuit generation stage, wherein the electrical circuit generation stage comprises associating a wire part of the electrical wire with another electrically conductive part to provide an electrical circuit comprising an electronic component. In specific embodiments, the electrical circuit generation stage may comprise associating the wire part to a lead frame, wherein the electronic component is functionally coupled with a lead frame, wherein the electrical circuit generation stage comprises pressing with a printer nozzle of the 3D printer a filament of 3D printable material comprising the wire part at least part of the wire part in a receptor part of the lead frame.

In embodiments, (i) the filament and (ii) the electrically conductive element, such as especially one or more of an electrically conductive coil, an electrically conductive wire, and an electronic component, are provided as integrated filament (e.g. on filament rolls). In yet other embodiments, the 3D printer is configured to assemble the electrically conductive element comprising filament. This (assembly) will be executed upstream of the nozzle, such as in the printer head (including a liquefier) or even upstream of the printer head.

As already indicated above, the printable material may already include the electrical wire connection with the electronic component. Hence, in embodiments the 3D printable material comprises said electronic component and one or more electrical conductors for functionally coupling the electronic component with a source of electrical energy (with said one or more electrical conductors functionally coupled with the electronic component). Here, the terms "electrical conductors" or "wiring" or "electrical wiring" or "electrical wires" especially (at least) refer to the wires or cables that are used to transport electricity, i.e. "copper". The wires may be insulated or non-insulated. The latter embodiment may also be applied as the polymeric material may be electrically insulating.

In a specific embodiment, a chain of electrically connected solid state light sources may be applied, which may be embedded in the printable material. Hence, in embodiments a plurality of solid state light sources electrically connected in series or parallel with electrical conductors are comprised by a filament of 3D printable material, with especially the electrical conductors configured parallel to a longitudinal axis (A) of the filament. Hence, the plurality of electrically connected solid state light sources may extend of tens of centimeters of even meters within the filament.

The printable material or filaments containing the electronic component with functionally coupled electrical conductors may be provided as integrated filament (e.g. on filament rolls). In yet other embodiments, the 3D printer is configured to assemble the electronic component with wiring comprising filament. This will be executed upstream of the nozzle, such as in the printer head (including a liquefier) or even upstream of the printer head. Therefore, in embodiments (wherein the fused deposition modeling (FDM) 3D printer comprises a printer nozzle), the method may comprise providing said (a) plurality of solid state light sources electrically connected in series or parallel with said electrical conductors and (b) a filament, and the method may further comprise combining said solid state light sources electrically connected in series or parallel with said electrical conductors and said filament upstream of the printer nozzle to provide downstream of said printer nozzle printable material comprising said plurality of solid state light sources electrically connected in series or parallel with said electrical conductors.

When printing, some extrusion may place in the printer head. In view of the present invention this extrusion function may, in embodiments, be reduced or may even be absent. Alternatively or additionally, to cope with extrusion effects the electrical wiring may include elastic units that allow for a stretching of the filament (and the electrical wiring). Therefore, in embodiments one or more electrical conductors provided to the fused deposition modeling (FDM) 3D printer have a spring-like segment allowing at least an elongation parallel to a length (axis) of the one or more electrical conductors (see also above).

A fused deposition modeling 3D printer for executing the method according to the invention may comprise (a) a printer head comprising a printer nozzle, and (b) a 3D printable material providing device configured to provide 3D printable material to the printer head. Further, the fused deposition modeling 3D printer may comprise (c) an electrically conductive element providing device, such as especially an electrical wire providing device, configured to provide an electrically conductive element, especially an electrically conductive wire to the filament, for example downstream of a filament elongation stage.

The fused deposition modeling 3D printer may be configured to combine the electrically conductive element, such as especially the electrically conductive wire, and the 3D printable material downstream of the printer nozzle of the 3D printer.

The 3D printable material providing device may be a filament providing device. The filament providing device may include one or more filament rollers or acceptors for one or more filament rollers. The filaments on the rollers may already include one or more electrically conductive elements. The term "3D printer" may also refer to a 3D printer system.

The filament or printable material may include the electronic component, or such electronic component including an electrical connection (wire(s)), may be assembled in the 3D printer. Therefore, the 3D printer may include an electronic component providing device configured to provide an electronic component to the filament or to the printer head.

Especially in case where the electronic component does not include electrical wiring, the electronic component providing device may be configured to provide an electronic component to the filament, such as by pressing and/or integrating in cavities in the filament. Especially in the case where the electronic component also includes electrical wiring, the electronic component providing device may be configured to provide the electronic component (functionally coupled with electrical wiring) to the printer head. In the printer head, the printable material including the electronic component (functionally coupled with electrical wiring) may be assembled, whereby the printable material downstream of the nozzle (thus) comprises the printable material including the electronic component (functionally coupled with electrical wiring).

It may be desirable to print the electrically conductive element e.g. at least partly independent of the bulk of the 3D printed material. To this end, the 3D printer may include more than one printer head. Hence, in embodiments the 3D printer further comprises a second printer head configured to 3D print printable material not comprising electrically conductive element.

A 3D printed item obtainable by the method according to the invention comprises (a) 3D printed material, (b) an electronic component embedded in said 3D printed material, and (c) an electrically conductive coil of at least part of an electrically conductive wire embedded in the 3D printed material and functionally coupled to the electronic component.

The electrically conductive coil may be configured as wireless electrical power receiving module. The coil may also be configured as one or more of receiver, transmitter, and transducer.

The 3D printed item comprises a plurality of electrical circuits, each comprising an electronic component and an electrically conductive coil, wherein two or more electrical circuits are separated by electrically insulating 3D printed material. Therefore, the invention thus also provides (in an aspect) 3D printable material comprising a plurality of electrical circuits each comprising an electronic component and an electrically conductive coil, wherein two or more electrical circuits are separated by electrically insulating 3D printable material.

A device may comprise such 3D printed item or a plurality of such 3D printed items, which may optionally also functionally be coupled. The electrical conductor embedded in the 3D printed material may also partly protrude from the 3D printed material, such as for an electrical connection with an electronic component or source of electrical energy external from the 3D printed material (i.e. external from the 3D printed item)

BRIEF DESCRIPTION OF THE DRAWINGS

Embodiments of the invention will now be described, by way of example only, with reference to the accompanying schematic drawings in which corresponding reference symbols indicate corresponding parts, and in which.

The schematic drawings are not necessarily to scale.

DETAILED DESCRIPTION OF THE EMBODIMENTS

Figure 1A:
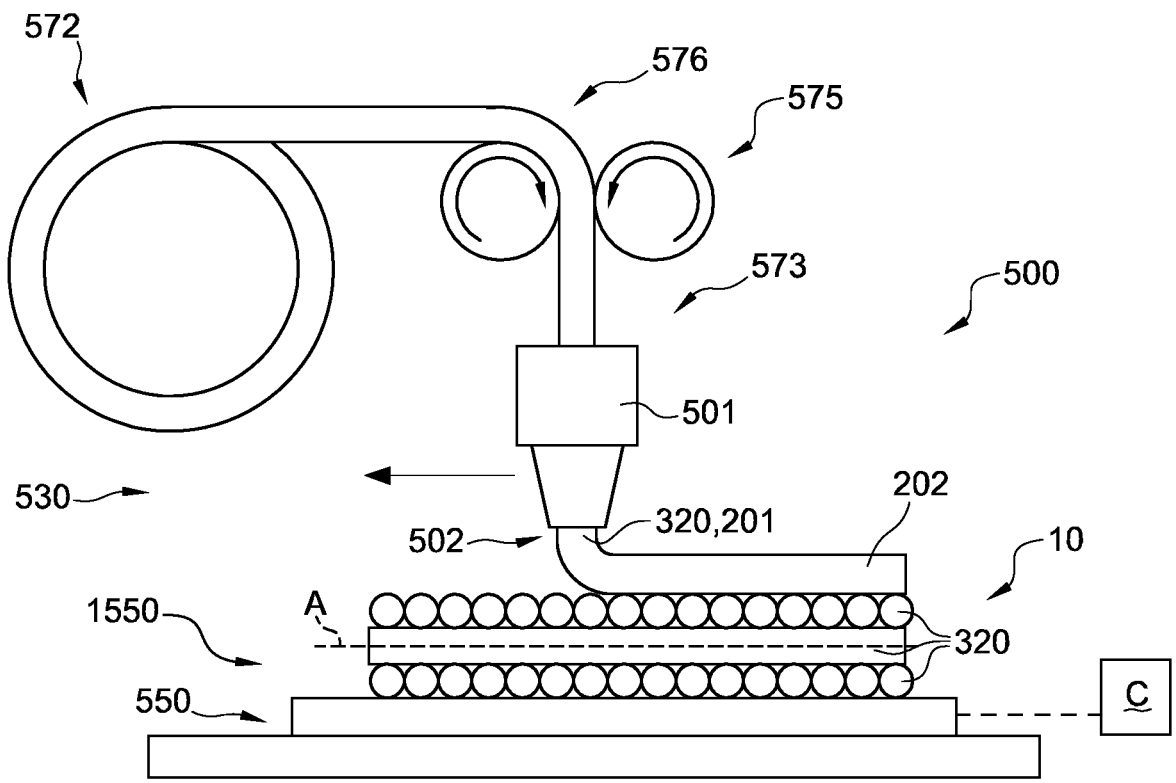
FIGS. 1a-1b schematically depict some general aspects of the 3D printer.

FIG. 1a schematically depicts some aspects of the 3D printer. Reference 500 indicates a 3D printer. Reference 530 indicates the functional unit configured to 3D print, especially FDM 3D printing; this reference may also indicate the 3D printing stage unit. Here, only the printer head for providing 3D printed material, such as a FDM 3D printer head is schematically depicted. Reference 501 indicates the printer head. The 3D printer of the present invention may especially include a plurality of printer heads, though other embodiments are also possible. Reference 502 indicates a printer nozzle. The 3D printer of the present invention may especially include a plurality of printer nozzles, though other embodiments are also possible. Reference 320 indicates a filament of printable 3D printable material (such as indicated above). For the sake of clarity, not all features of the 3D printer have been depicted, only those that are of especial relevance for the present invention (see further also below).

The 3D printer 500 is configured to generate a 3D item 10 by depositing on a substrate 1550, such as a receiver item 550, which may in embodiments at least temporarily be heated and cooled, a plurality of filaments 320 wherein each filament 20 comprises 3D printable material, such as having a melting point $T_m$. The 3D printer 500 is configured to heat the filament material upstream of the printer nozzle 502. This may e.g. be done with a device comprising one or more of an extrusion and/or heating function. Such device is indicated with reference 573, and is arranged upstream from the printer nozzle 502 (i.e. in time before the filament material leaves the printer nozzle 502). The printer head 501 may (thus) include a liquefier or heater. Reference 201 indicates printable material. When deposited, this material is indicated as (3D) printed material, which is indicated with reference 202.

Reference 572 indicates a spool or roller with material, especially in the form of a wire. The 3D printer 500 transforms this in a filament or fiber 320 on the substrate 1550 or on already deposited printed material. In general, the diameter of the filament downstream of the nozzle is reduced relative to the diameter of the filament upstream of the printer head. Hence, the printer nozzle is sometimes (also) indicated as extruder nozzle. Arranging filament by filament and filament on filament, a 3D item 10 may be formed. Reference 575 indicates the filament providing device, which here amongst others include the spool or roller and the driver wheels, indicated with reference 576.

Reference A indicates a longitudinal axis or filament axis.

Reference C schematically depicts a control system, such as especially a temperature control system configured to control the temperature of the substrate 1550. The control system C may include a heater which is able to heat the substrate 1550 to at least a temperature of 50° C., but especially up to a range of about 350° C., such as at least 200° C.

Figure 1B:
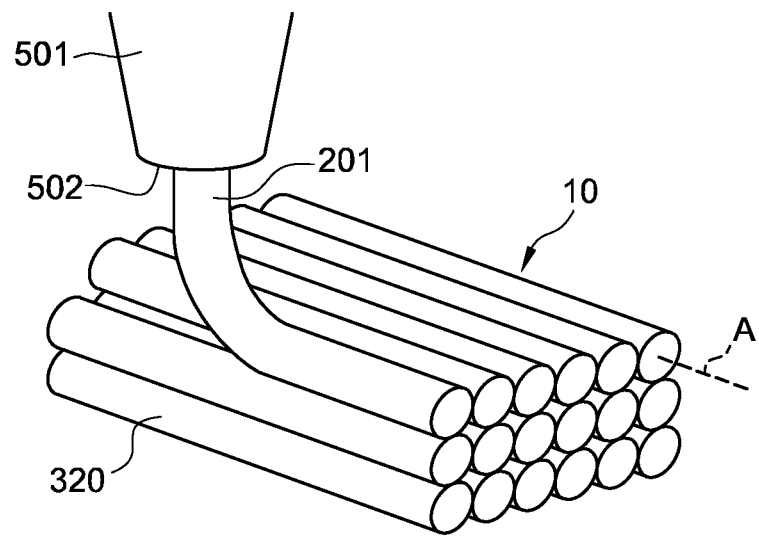

FIG. 1b schematically depicts in 3D in more detail the printing of the 3D item 10 under construction. Here, in this schematic drawing the ends of the filaments 320 in a single plane are not interconnected, though in reality this may in embodiments be the case.

Hence, FIGS. 1a-1b schematically depict some aspects of a fused deposition modeling 3D printer 500, comprising (a) a first printer head 501 comprising a printer nozzle 502, (b) a filament providing device 575 configured to provide a filament 320 comprising 3D printable material 201 to the first printer head 501, and optionally (c) a substrate 1550. In FIGS. 1a-1b, the first or second printable material or the first or second printed material are indicated with the general indications printable material 201 and printed material 202.

Below, especially LEDs as examples of electronic components 40 are given. However, unless indicated otherwise or clear from the description for a person skilled in the art, instead of a LED also another electronic component may be applied. Solid state light sources, such as LEDs, are indicated with reference 141.

The electronic component may be an electronic device such as a battery, a photovoltaic cell, a sensor or any other small electronic element. Also other elements may (additionally) be included.

Figure 2A:
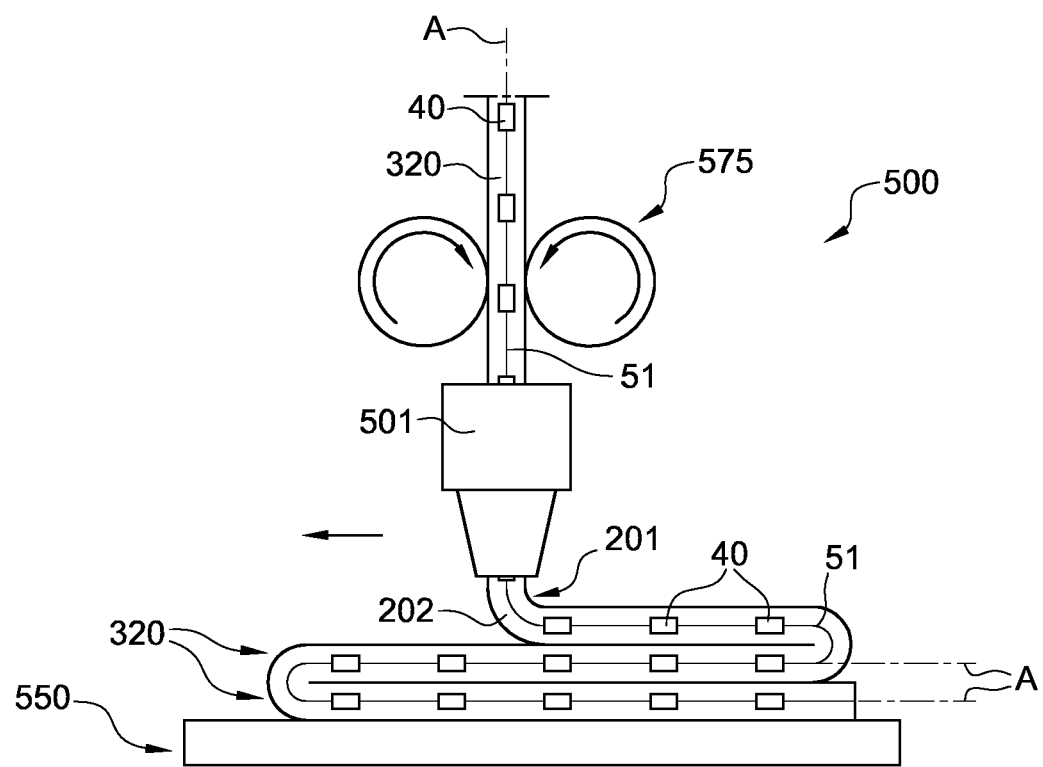
FIGS. 2a-2d schematically depict various aspects of the method and/or 3D printer.

It may further be desirable to be able to make a filament 320 which contains wired electronic components, such as wired LEDs, incorporated in therein, which can be printed using FDM printers (FIG. 2a). Reference A indicates a longitudinal axis.

Herein, various configurations, measures and materials which can enable 3D printing wired (i.e. connected) LEDs embedded in a polymer while preventing issues such as breaking of contacts during printing are provided.

Figure 2B:
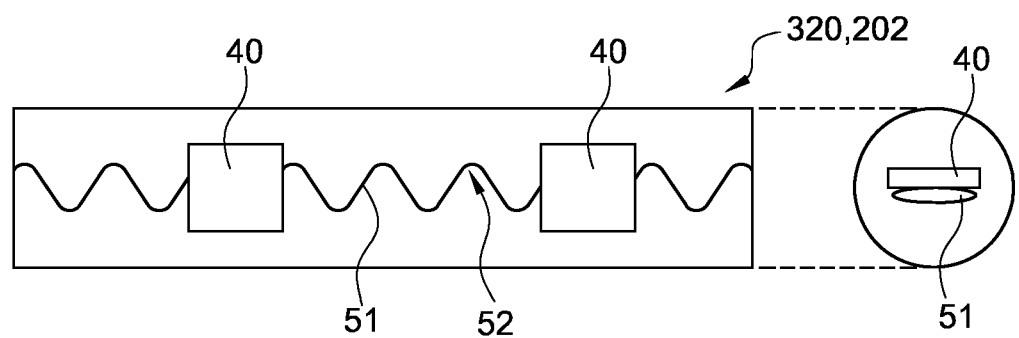

In another embodiment, the wires connecting the LEDs are shaped such that it allows for flexibility (FIG. 2b). For instance, (electrically conductive) spring-like elements 52 may be provided. In embodiments, the wires 52 connecting the LEDs are protected with a coating. In yet other embodiments, multiple (conductive) wires may be used. Thermoplastic materials which can be used include but are not limited to thermoplastics ABS, ABSi, polyphenylsulfone (PPSF), polycarbonate (PC), and Ultem 9085.

Figure 2C:
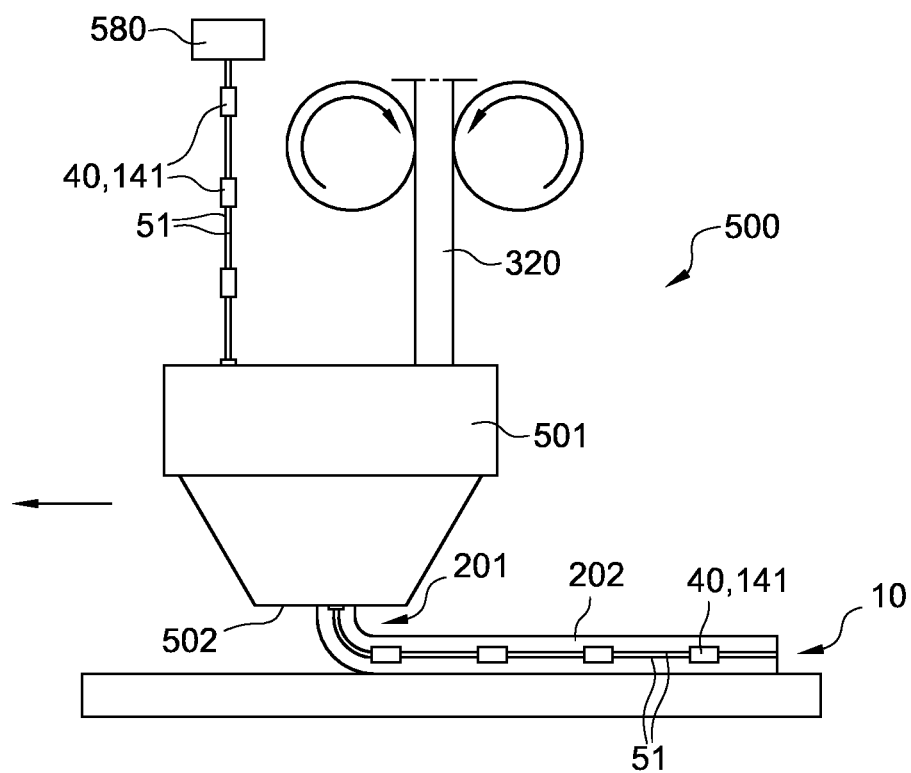

In yet another embodiment the filament is shaped such that it is more likely to prevent issues such as breaking of contacts during printing. FIG. 2a may schematically refer to the filament FIG. 2c schematically depicts the combination of with electrical wires 51 connected electronic components 40 which are combined with a filament 320 in the printer head 501 and provided as printable material 201 downstream of the nozzle 501. Here, the electronic component providing device 500 provides electronic components that are electrically connected via electrical wires 51.

Figure 2D:
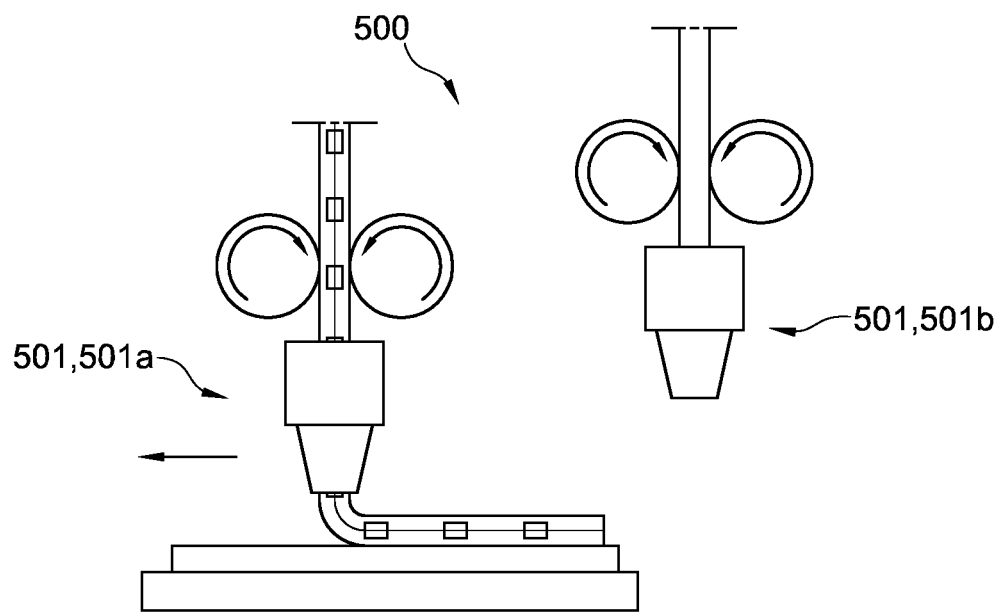

As indicated above, the 3D printer may have 2 printing heads. One for printing wired LEDs, one for printing a polymeric material without any wired LEDs. This is schematically depicted in FIG. 2d.

In this way, it is possible to print a 3D structure consisting of sections comprising a filament with wired LEDs and sections comprising no filament with wired LEDs. It may also be possible to print a 3D structure with multiple filaments with wired LEDs, etc.

One method of applying conductive wires is by feeding a wire (e.g. copper wire) into the (separate path in the) nozzle of an FDM printer. While the printer is extruding plastic out of the nozzle, the wire is pulled with the extruded plastic (see FIG. 3a). Such printer head 501 may be used for combining the electrically conductive wire 51 and the 3D printable material 201 downstream of a printer nozzle 502 of the 3D printer 500. Hence, FIG. 5a also very schematically depicts an embodiment of a fused deposition modeling 3D printer 500 comprising a printer head 501, comprising a printer nozzle 502, a 3D printable material providing device 575 configured to provide 3D printable material 201 to the printer head 501, and an electrical wire providing device 580 configured to provide an electrical wire 51 to the filament 320 downstream of a filament elongation stage 505.

Expending on this method of incorporating wires into the extruded filament while printing, one can consider embedding segments of (thin) wire shaped conductors with electronic components integrated onto them. One way of making such segments is by a lead frame populated with electronic components that form a circuit. One can also think of embedding these segments into the filament upon production of the filament itself.

The invention may in embodiments especially include (i) forming an electrical circuit including a conductive wire, (ii) embedding the circuit into the printed filament and/or having the circuit embedded in the 3D printable material, such as a filament, yet to be printed, and (iii) making a functional system consisting of the embedded electrical circuits.

In embodiments, one may e.g. use lead-frame technology to form the electrical circuit. This technology is known and reliable and in this way a good basis for making electrical circuits. Furthermore, it is proposed to make use of a technology where the lead-frame is populated with electronic components while in a compact form factor and later on stretched to form wires. Amongst others, this is described in WO2013/035017, which is herein incorporated by reference.

It may be desirable to protect the electrical circuit for bending during the printing process. It is also desired to protect the circuit from too high temperatures during embedding into the filament and printing. This can be solved by the use of materials that withstand elevated temperatures, such as at least 300° C., as well as process conductions during embedding and printing that limit the required temperature of melting the filament (e.g. election of a filament material with low melting temperature, such as e.g. 150° C.).

Figure 3A:
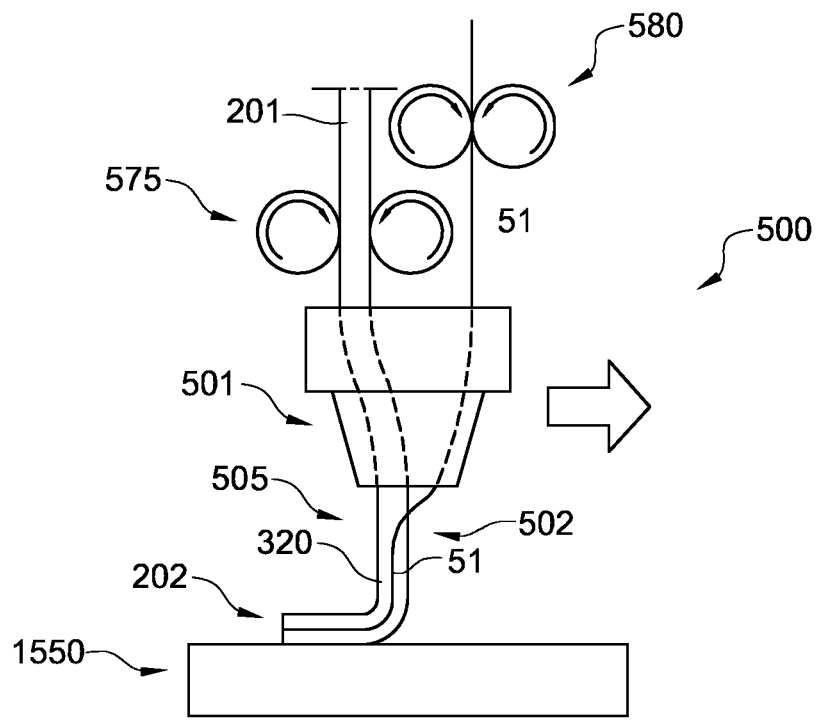
FIGS. 3a-3i schematically depict some aspects, embodiments and variants.
Figure 3B:
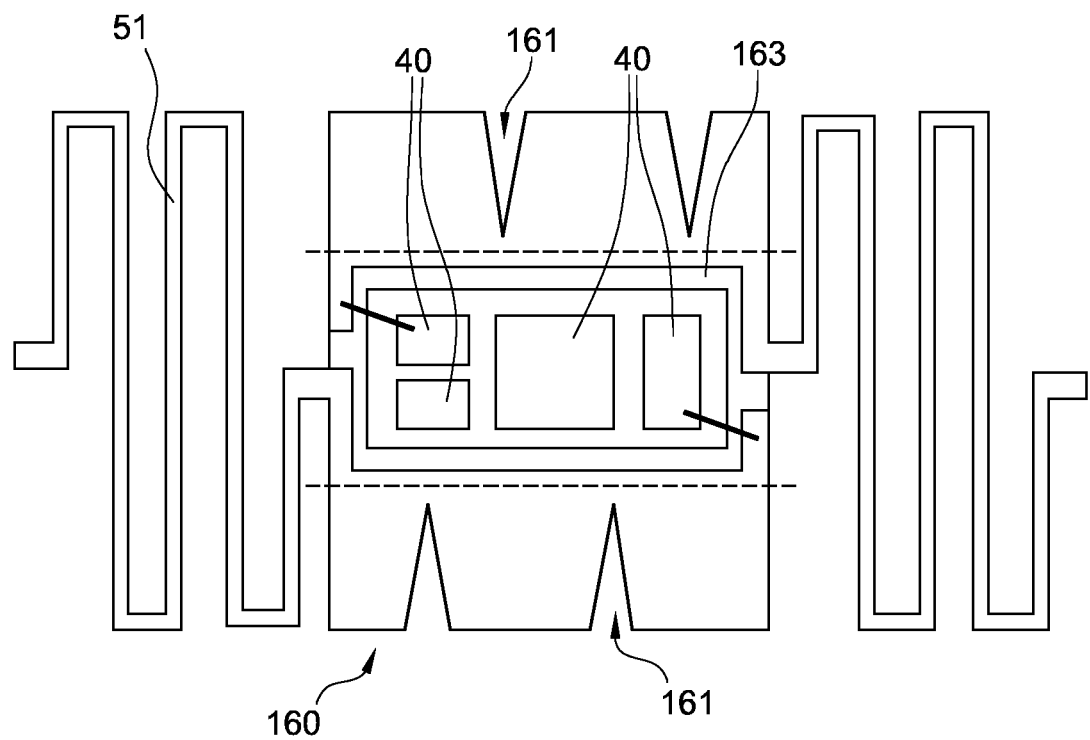

FIG. 3b schematically shows an embodiment of a typical layout of a lead frame section with the electronic circuit. A laminate is used to isolate the conductive plate that hold the electronic components form the rest of the lead frame. For instance, V-grooves are made with the intention to connect the meandered wires back to the lead frame during FDM embedding of the circuit (explained later on). Also a plurality of coupled lead frames may be applied. The wire meander can be used to stretch the wires.

Hence, FIG. 3b also schematically depicts embodiments of an electronic component 40 in electrically conductive contact with the electrically conductive wire 51. As indicate above, the electronic component 40 comprises one or more of a solid state light source and a sensor. Here, schematically a plurality of electronic components 40 are depicted. The electronic component(s) 40 is (are) here functionally coupled with a lead frame 160. Here, the lead frame 160 comprises a receptor part 161, such as a V-groove. Reference 162 refers to a laminate, on which the electronic components 40 may be configured. The electrically conductive wires 51 are functionally coupled with the electronic components 40. Further, the electronic components 40 may also be functionally coupled.

Figure 3C:
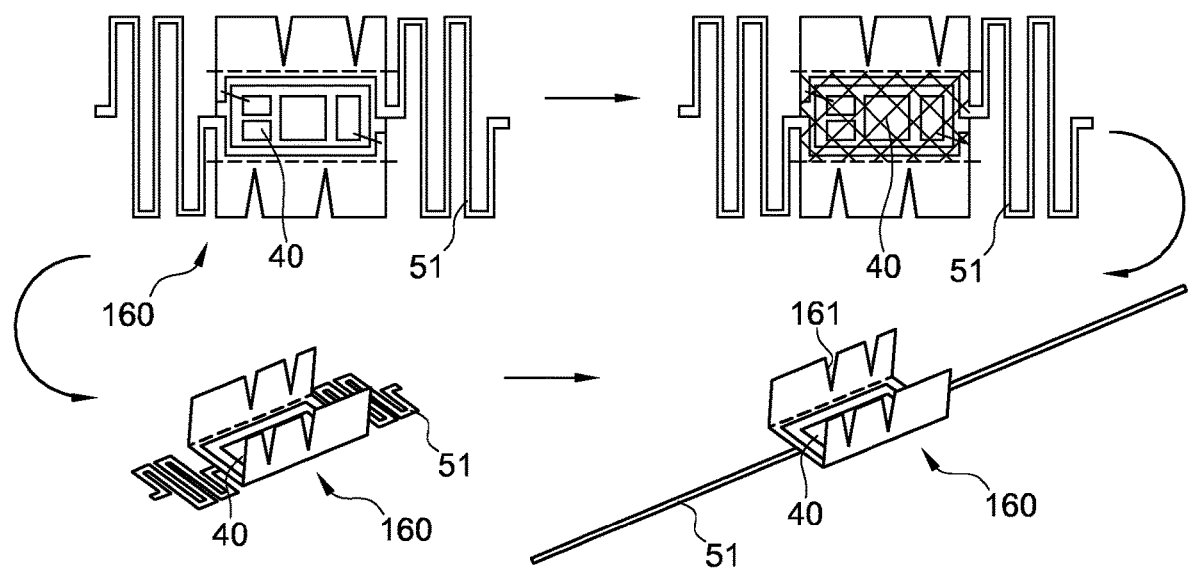

In FIG. 3c. possible steps are shown to come to a wire section that is fit for embedding into FDM filament. It starts off with the lead-frame section of FIG. 3a (FIG. 3c: top left). Then the electronic circuit is protected by an overmould of a material that is sufficiently heat resistant (FIG. 3c: top right). Afterwards the lead-frame is shaped to make a kind of rigid frame around the electronics that protects it against bending (FIG. 3c: bottom left). After the shaping the V-grooves are positioned correctly for interconnect during printing. Finally, the lead frame is stretched as shown for one section (FIG. 3c bottom right).

FIGS. 3b and 3c schematically depict embodiments wherein at least part of the electrically conductive wire 51 is in a compressed state allowing elongation of the electrically conductive wire 51 when the 3D printable material is stretched out in a filament elongation stage.

The typical dimensions of this frame with electronics should especially be (well) below the minimum bending radius of the filament during printing.

Figure 3D:
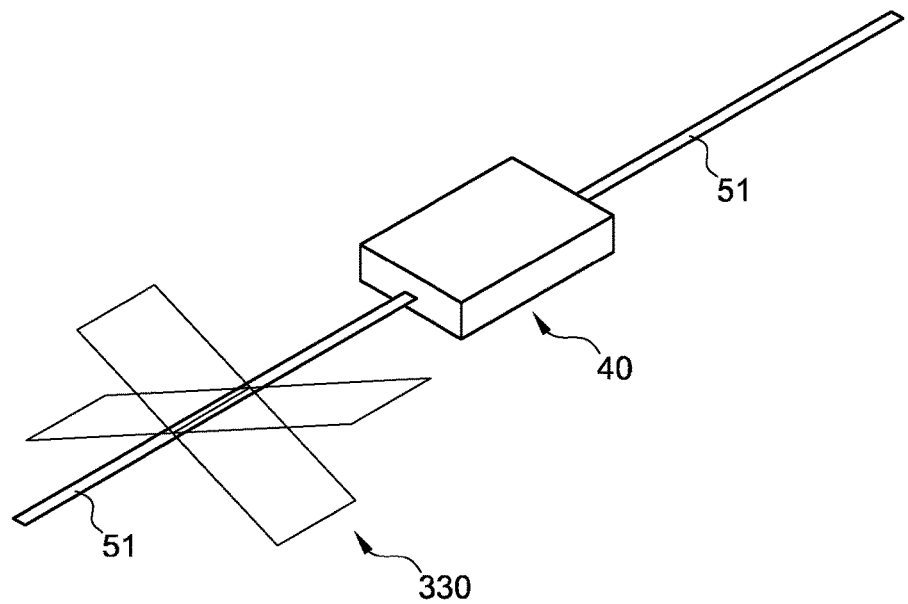

A measure to reduce bending stress on the circuits is to make sure that the circuit remains in the center of the filament (neutral plane). This can be accomplished with guide flaps as schematically shown in FIG. 3d. Hence, FIG. 3d schematically depicts an embodiment wherein the electrically conductive wire 51 comprises (or is functionally coupled with) a stability element 330, especially for maintaining the electrically conductive wire 51 embedded in the 3D printable material of a filament downstream of a printer nozzle of the 3D printer (see also FIG. 3f).

Figure 3E:
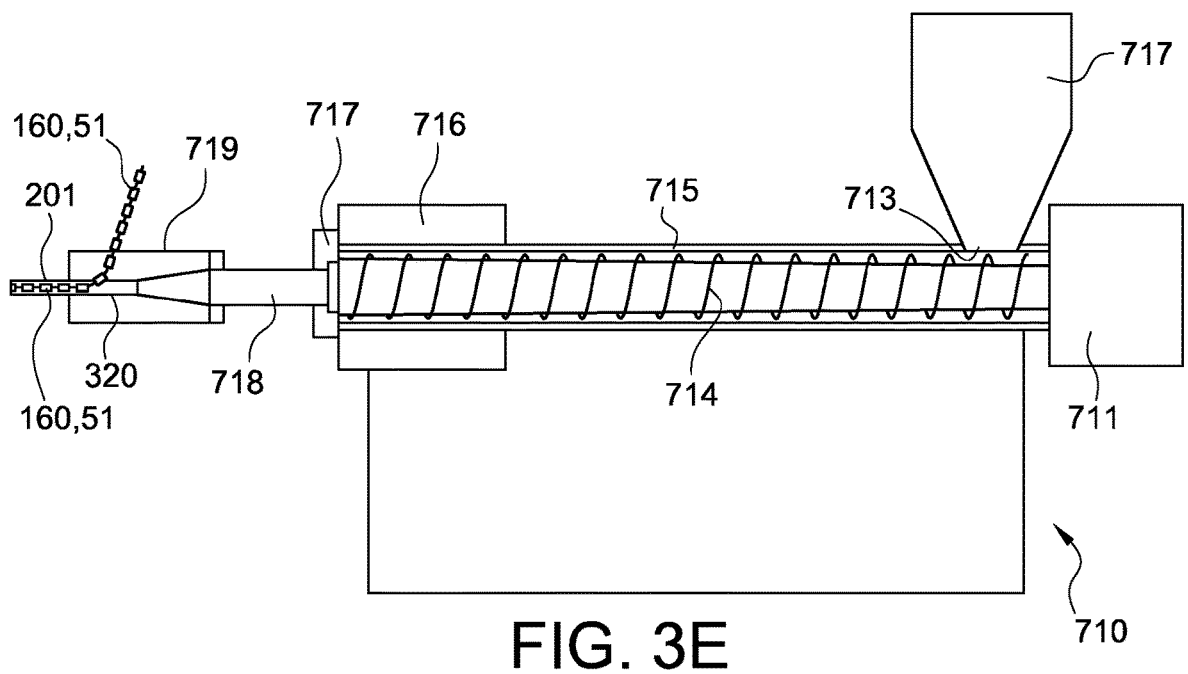

The circuits can either be embedded into the filament at filament production or at extrusion of the filament during printing as shown in FIG. 3a. FIG. 3e shows a schematic layout of an embodiment of a filament extruder 710, which is an example of a 3D printable material providing device 575. At the output side marked by die 719, the (partly) stretched lead frame 160,51 is inserted into the plastic filament 320. One complication when embedding the circuits at filament production is that in common FDM printing the extruded plastic diameter coming out of the printer nozzle is smaller than the filament diameter. This would require the circuits to stretch. A possible way to get around this is to not fully stretch the lead-frame and allow for more stretching during printing or to keep the extruded filament diameter during printing equal to the initial diameter. Reference 711 indicates a screw driver motor and reference 712 indicates a hopper. A feed throat is indicated with reference 713, and reference 714 indicates a screw. Reference 715 indicates a barrel. Reference 716 indicates a heater and reference 717 indicates a breaker plate. Further, reference 718 indicates a feed pipe and reference 719 a die. The indication 160,51 is herein used to indicate the functional combination of a wire and a lead frame, such as shown in FIGS. 3c (and 3b and 3f).

Figure 3F:
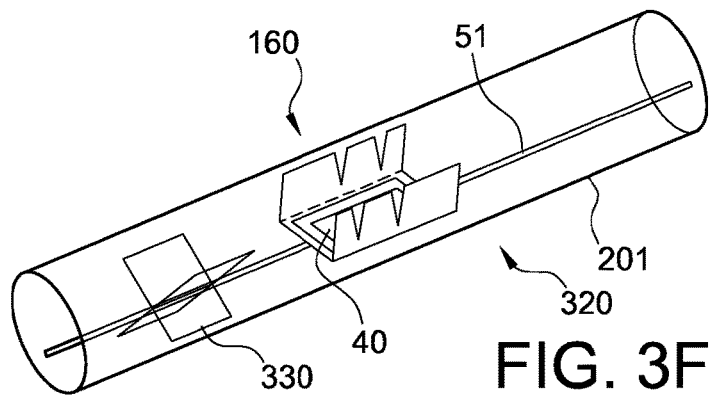

FIG. 3f shows what the filament 320 looks like with a lead-frame 160 with circuit segment inserted. The material type that the circuit is embedded in can be of the same type as the (printed) substrate material that the circuit is applied to. This ensures reliable fusion. On the other hand one could embed in a different material on purpose for material characteristics that are more favorable for the embedded circuit (e.g. softer, more flexible). In that case care should be taken of the material compatibility with the substrate material.

Figure 3G:
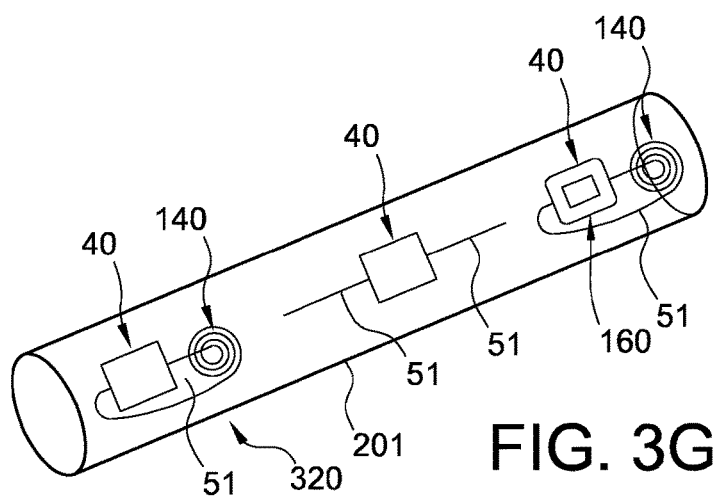

Taking into account that the functions of the electrical circuits that are embedded can differ, there are various approaches to dealing with the delivery of different circuits to the 3D printed product. In the case that the circuit is already part of the filament (inserted during filament production), the filament could be filled with only one type of circuit and multiple filaments are used to build the system during 3D printing (requires filament change or multi nozzle print head). Or during production of the filament the circuits could already be pre-arranged in the right order and at the right distance between each other as shown in FIG. 3g. FIG. 3g schematically depict embodiments wherein by way of example two circuits are depicted with each a coil 140 for inductive electrical powering of the electronic component(s) 40, of which on the right one is configured on a lead frame 160. In the middle, an electronic component 40 is depicted, functionally coupled to electrically conductive wires 51. These will later have to be configured in a circuit, such as by providing a circuit by printing or by contacting the wires with an external source of electrical energy.

FIG. 3g may in fact also schematically depict an embodiment wherein the 3D printed item 10 comprises a plurality of electrical circuits each comprising an electronic component 40 and an electrically conductive coil 140, wherein two or more electrical circuits are separated by electrically insulating 3D printed material.

When the embedding of the circuits takes place at the moment of printing (according to FIG. 3a), the stretched lead-frames could be delivered on reals per different circuit type and inserted into the printing in the required order (similar to pick-and-place machines). Also the stretching of the lead frame could be done right at the moment of printing, requiring the circuits to be supplied in lead-frame form instead of reals.

The proposed method of making electrical circuits fits better to low power (or signaling) functions than to circuits that need to deliver considerable power. Here, we consider a luminaire product that is based on an architecture with standard electronic parts for mains conversion, LED current driver(s) and LED board(s). The additional functionalities offered by the electrical circuits embedded by printing could be: sensors and sensor readout, wireless communication, communication relaying in the luminaire housing and lighting controls.

The technology of printing the circuits is less suited to make many circuit connections. To circumvent that issue we make use of inductive coupling between the embedded circuits. Both power and signals can be transferred over an inductive coupling. Signals could be sent in a serial manner, reducing the amount of signaling channels.

Figure 3H:
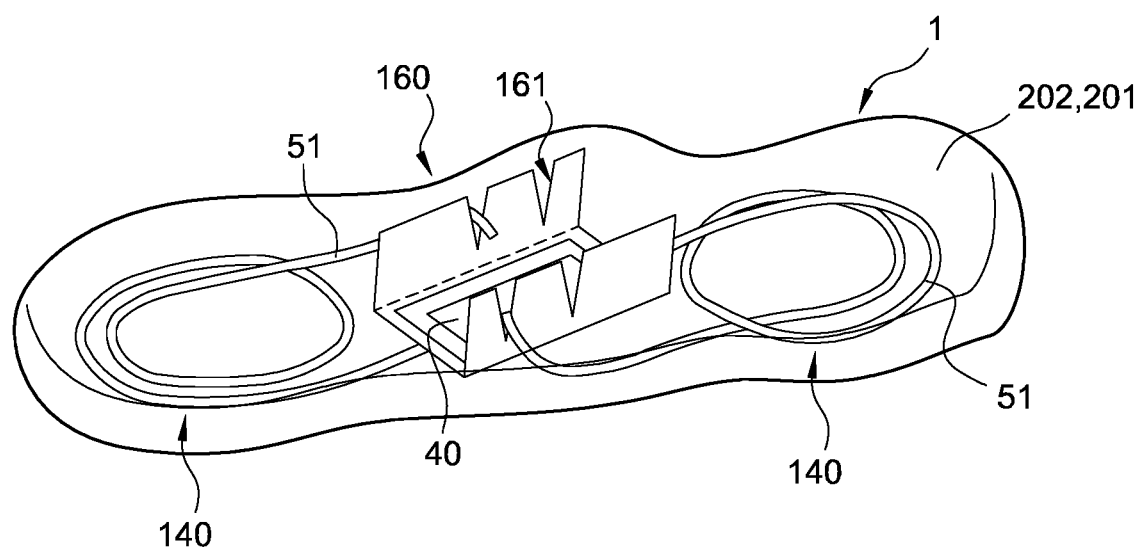

FIG. 3h. shows what an embedded circuit in an embodiment could look like when the two wire tails of the lead frame are coiled up into coils for powering and signaling. The end of the coil is reconnected to the lead-frame via pressing the wire end into the V-grooves of the lead-frame. This closes the loop required for the induction coil.

Figure 3I:
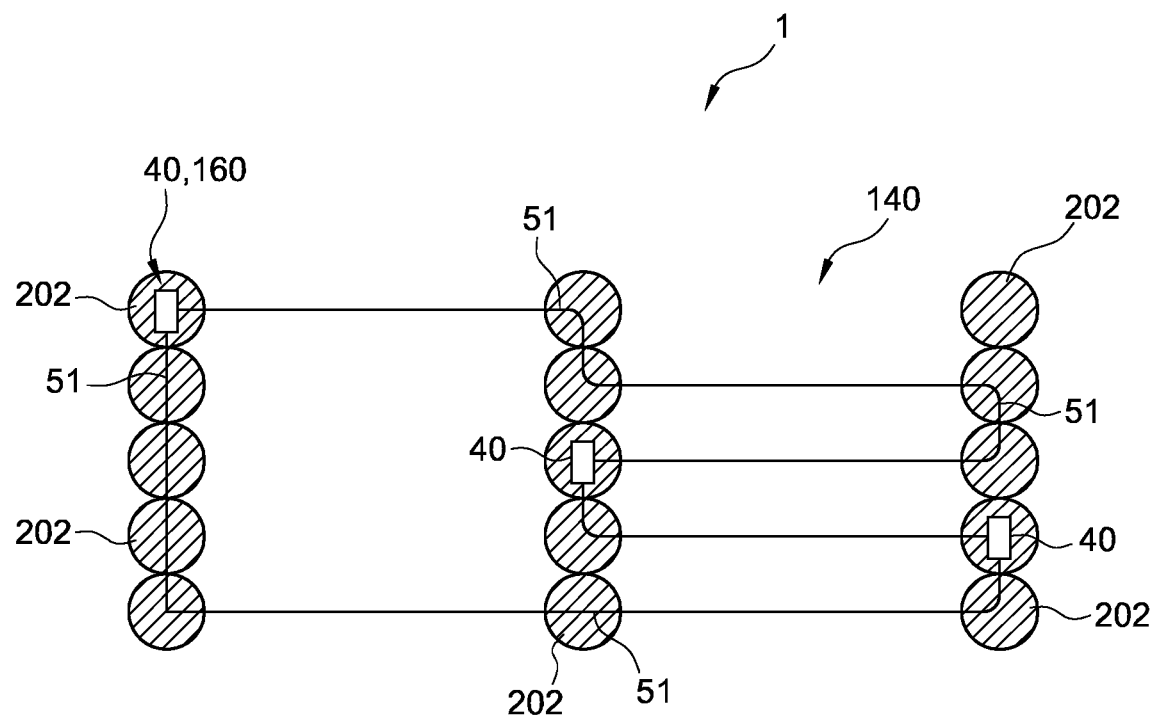

FIG. 3i schematically shows a (preferably) 3D printed luminaire housing with an electronic circuit embedded via the printing process described above. The circuit in this case may e.g. comprise a sensor, a frond-end for wireless communication and signal relay circuits. There may be a central driver/control unit that is linked to the circuits via inductive coupling. Note that due to printing a an electrically conductive wire, a coil 140 is formed. The drawing very schematically shows a cross-section. The three stacks of printed filaments may e.g. be walls.

The term "substantially" herein, such as in "substantially consists", will be understood by the person skilled in the art. The term "substantially" may also include embodiments with "entirely", "completely", "all", etc. Hence, in embodiments the adjective substantially may also be removed. Where applicable, the term "substantially" may also relate to 90% or higher, such as 95% or higher, especially 99% or higher, even more especially 99.5% or higher, including 100%. The term "comprise" includes also embodiments wherein the term "comprises" means "consists of". The term "and/or" especially relates to one or more of the items mentioned before and after "and/or". For instance, a phrase "item 1 and/or item 2" and similar phrases may relate to one or more of item 1 and item 2. The term "comprising" may in an embodiment refer to "consisting of" but may in another embodiment also refer to "containing at least the defined species and optionally one or more other species".

Furthermore, the terms first, second, third and the like in the description and in the claims, are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

The devices herein are amongst others described during operation. As will be clear to the person skilled in the art, the invention is not limited to methods of operation or devices in operation.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. Use of the verb "to comprise" and its conjugations does not exclude the presence of elements or steps other than those stated in a claim. The article "a" or "an" preceding an element does not exclude the presence of a plurality of such elements. The invention may be implemented by means of hardware comprising several distinct elements, and by means of a suitably programmed computer. In the device claim enumerating several means, several of these means may be embodied by one and the same item of hardware. The mere fact that certain measures are recited in mutually different dependent claims does not indicate that a combination of these measures cannot be used to advantage.

The invention further applies to a device comprising one or more of the characterizing features described in the description and/or shown in the attached drawings. The invention further pertains to a method or process comprising one or more of the characterizing features described in the description and/or shown in the attached drawings.

The various aspects discussed in this patent can be combined in order to provide additional advantages. Further, the person skilled in the art will understand that embodiments can be combined, and that also more than two embodiments can be combined. Furthermore, some of the features can form the basis for one or more divisional applications.

The invention claimed is:

1. A method for manufacturing a 3D item, wherein the method comprises the step of:
   printing, with a fused deposition modeling 3D printer, during a printing stage, a 3D printable material to provide the 3D item,
   wherein an electrically conductive wire and at least one electronic component in electrically conductive contact with the electrically conductive wire are embedded within the 3D printable material, and
   wherein the printed 3D item comprises at least one electrically conductive coil comprised of the electrically conductive wire.

2. The method according to claim 1, wherein the fused deposition modeling 3D printer has a printer head with a printer nozzle, and wherein the method further comprises the step of:
   providing the 3D printable material by combining, in the printer head, a filament and the electrically conductive wire in electrically conductive contact with the at least one electronic component.

3. The method according to claim 1, wherein the fused deposition modeling 3D printer has a printer head with a printer nozzle, and wherein the method further comprises the steps of:
   feeding a filament comprising the 3D printable material into the printer head, feeding the electrically conductive wire in electrically conductive contact with the at least one electronic component into the printer head,
   wherein the filament and the electrically conductive in electrically conductive contact with the at least one electronic component are introduced to the printer head-via separate paths,
   combining the filament and the electrically conductive wire in electrically conductive contact with the at least one electronic component in the printer head, and
   coextruding the combined filament and electrically conductive wire in electrically conductive contact with the at least one electronic component from the printer nozzle.

4. The method according to claim 1, wherein the at least one electronic component comprises one or more of a thermocouple, a thermopile, a resistor, a transistor, a diode, a battery, a capacitor, a super capacitor, a heating resistor, a Hall sensor, a PV cell, an organic semiconductor, an accelerometer, an electronic compass, a gyroscope, and an electronic circuit.

5. The method according to claim 1, wherein the at least one electronic component, or the electronic component and the electrically conductive wire together, have a length of at least a length of a printer head of the fused deposition modeling 3D printer.

6. The method according to claim 1, further comprising an electrical circuit generation stage, wherein the electrical circuit generation stage comprises associating a portion of the electrically conductive-wire with another electrically conductive part to create an electrical circuit.

7. The method according to claim 6, wherein the another electrically conductive part is a lead frame,
   wherein the electronic component is functionally coupled with the lead frame,
   wherein the electrical circuit generation stage comprises pressing, with a printer nozzle of the fused deposition modeling 3D printer, a filament of 3D printable material comprising the portion of the electrically conductive wire in a receptor part of the lead frame.

8. The method according to claim 1, comprising controlling the printing of the electrically conductive wire to create, during the printing stage, a coil configuration and provide, thereby, the electrically conductive coil.

9. The method according to claim 1, wherein at least part of the electrically conductive wire is in a compressed state allowing elongation of the electrically conductive wire when the 3D printable material is stretched out in a filament elongation stage.

10. The method according to claim 1, wherein the electrically conductive wire comprises a stability element for maintaining the electrically conductive wire embedded in the 3D printable material downstream of a printer nozzle of the 3D printer.

* * * * *